US006974729B2

(12) United States Patent
Collaert et al.

(10) Patent No.: US 6,974,729 B2
(45) Date of Patent: Dec. 13, 2005

(54) INTEGRATED SEMICONDUCTOR FIN DEVICE AND A METHOD FOR MANUFACTURING SUCH DEVICE

(75) Inventors: Nadine Collaert, Blanden (BE); Kristin De Meyer, Herent (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 60 days.

(21) Appl. No.: 10/621,044

(22) Filed: Jul. 15, 2003

(65) Prior Publication Data

US 2005/0020020 A1 Jan. 27, 2005

Related U.S. Application Data

(60) Provisional application No. 60/396,710, filed on Jul. 16, 2002.

(30) Foreign Application Priority Data

Jul. 17, 2002 (EP) .................................. 02447135

(51) Int. Cl.$^7$ ............................................. H01L 21/84
(52) U.S. Cl. ...................... 438/157; 438/283; 438/284; 257/365; 257/401
(58) Field of Search ................................. 438/157, 238, 438/299, 585, 283, 284; 257/347, 365, 401

(56) References Cited

U.S. PATENT DOCUMENTS

| | | | | |
|---|---|---|---|---|
| 6,107,663 | A | * | 8/2000 | Noble et al. ................. 257/351 |
| 6,118,161 | A | | 9/2000 | Chapman et al. |
| 6,207,511 | B1 | | 3/2001 | Chapman et al. |
| 6,252,284 | B1 | | 6/2001 | Muller et al. |
| 6,483,156 | B1 | * | 11/2002 | Adkisson et al. ........... 257/401 |
| 6,583,469 | B1 | * | 6/2003 | Fried et al. ................. 257/329 |
| 6,689,650 | B2 | * | 2/2004 | Gambino et al. ........... 438/157 |
| 6,716,684 | B1 | * | 4/2004 | Krivokapic et al. ........ 438/157 |

OTHER PUBLICATIONS

Choi, et al., "Nanoscale CMOS Spacer FinFET for the Terabit Era", IEEE Electron Device Letters, vol. 23, No. 1, pp. 25-27, (Jan. 2002).
Choi, et al., "Sub-20nm CMOS FinFet Technologies", IEEE, pp. 421-424, (2001).
Hisamoto, et al., "A Folded-channel MOSFET for Deep-sub-tenth Micron Era", International Electron Devices Meeting, pp. 1032-1034, (1998).
Huang, et al., "Sub-50 nm P-Channel FinFET", IEEE Transactions on Electron Devices, vol. 48, No. 5, pp. 880-886, (May 2001).
Kedzierski, et al., "High-performance symmetric-gate and CMOS-compatible V, asymmetric-gate FinFET devices", IEEE, pp. 437-440, (2001).
European Search Report dated Dec. 17, 2002 for European Application No. 02 44 7135.1.

* cited by examiner

Primary Examiner—Trung Dang
(74) Attorney, Agent, or Firm—Knobbe Martens Olson & Bear LLP

(57) ABSTRACT

A CMOS circuit for and method of forming a FinFET device is disclosed. The method includes providing a substrate comprising a semiconductor layer, forming on the semiconductor layer active areas insulated from each other by field areas, forming at least one dummy gate on at least one of said active areas and forming source and drain regions on the at least one of the active areas. The method also includes covering the substrate with an insulating layer leaving said dummy gate exposed and forming an open cavity by patterning the dummy gate to form a dummy fin and a semiconductor fin aligned to said dummy fin, both fins extending from the source to the drain regions.

31 Claims, 12 Drawing Sheets

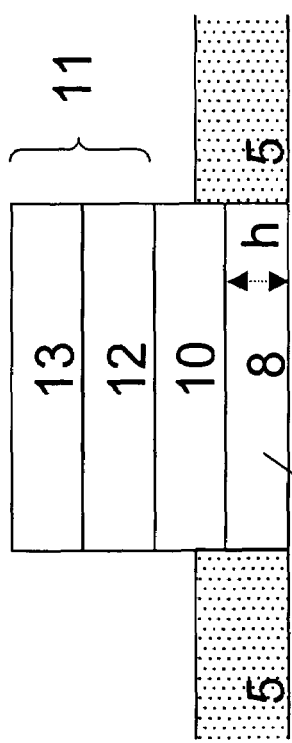
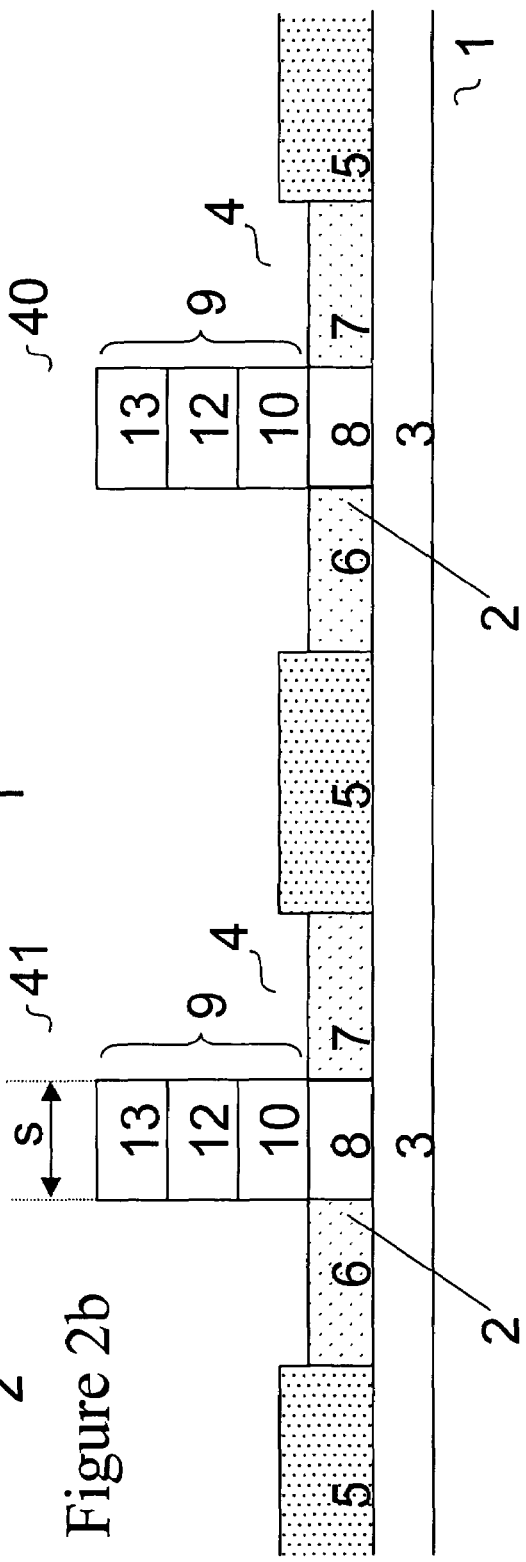
Figure 2a
Figure 2b

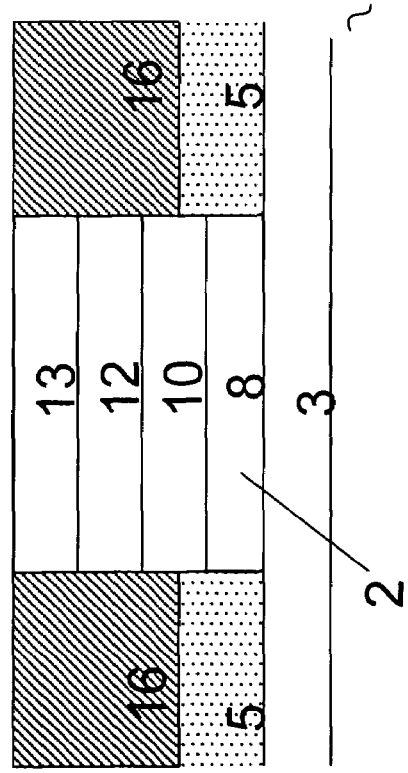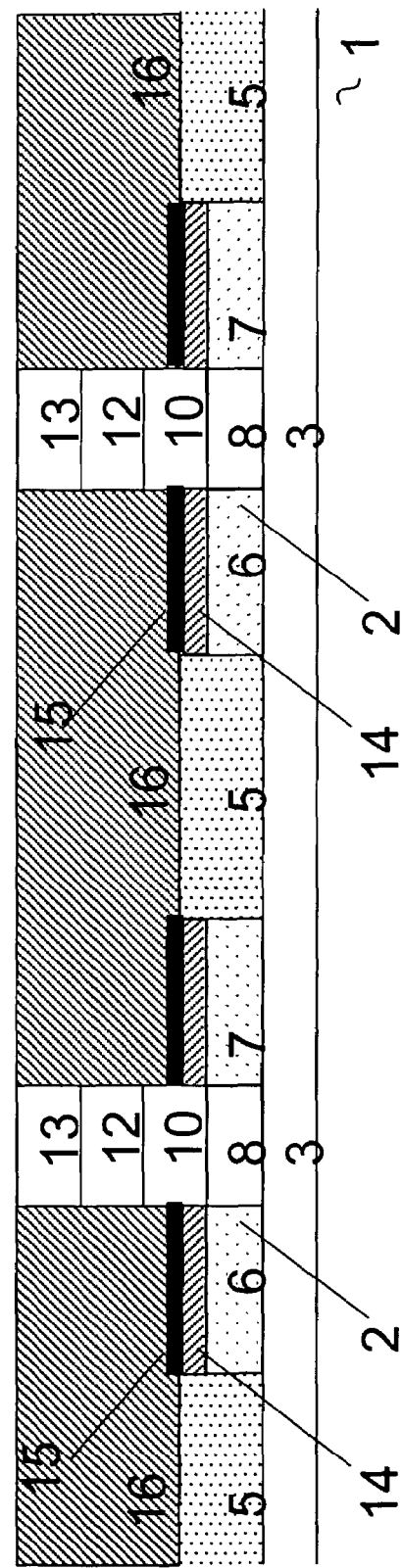
Figure 3a
Figure 3b

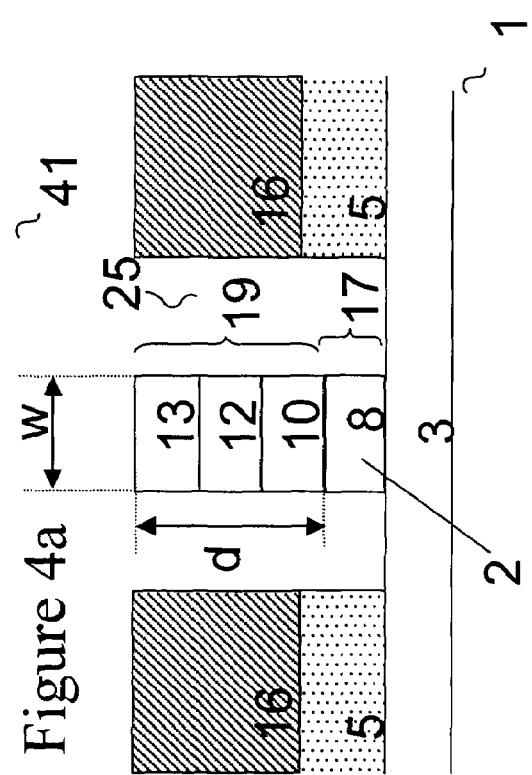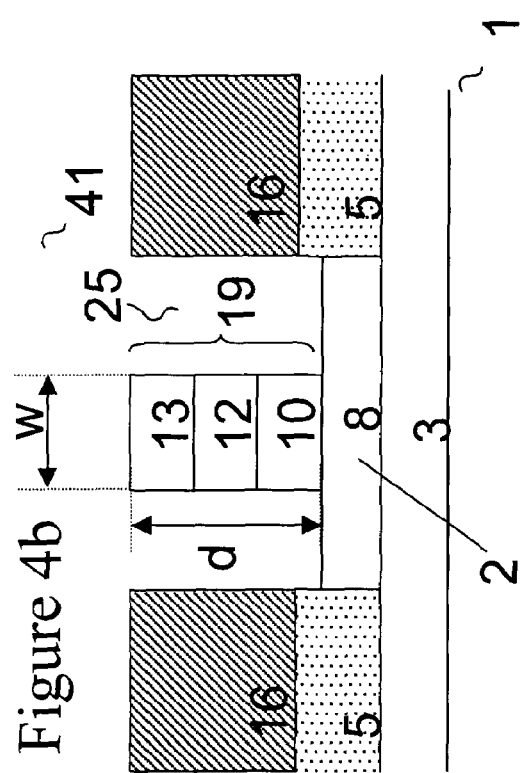

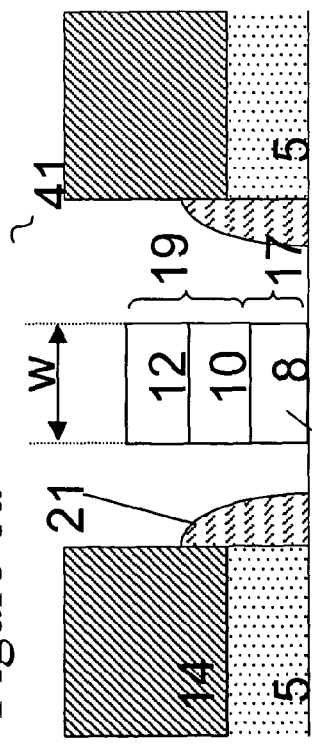
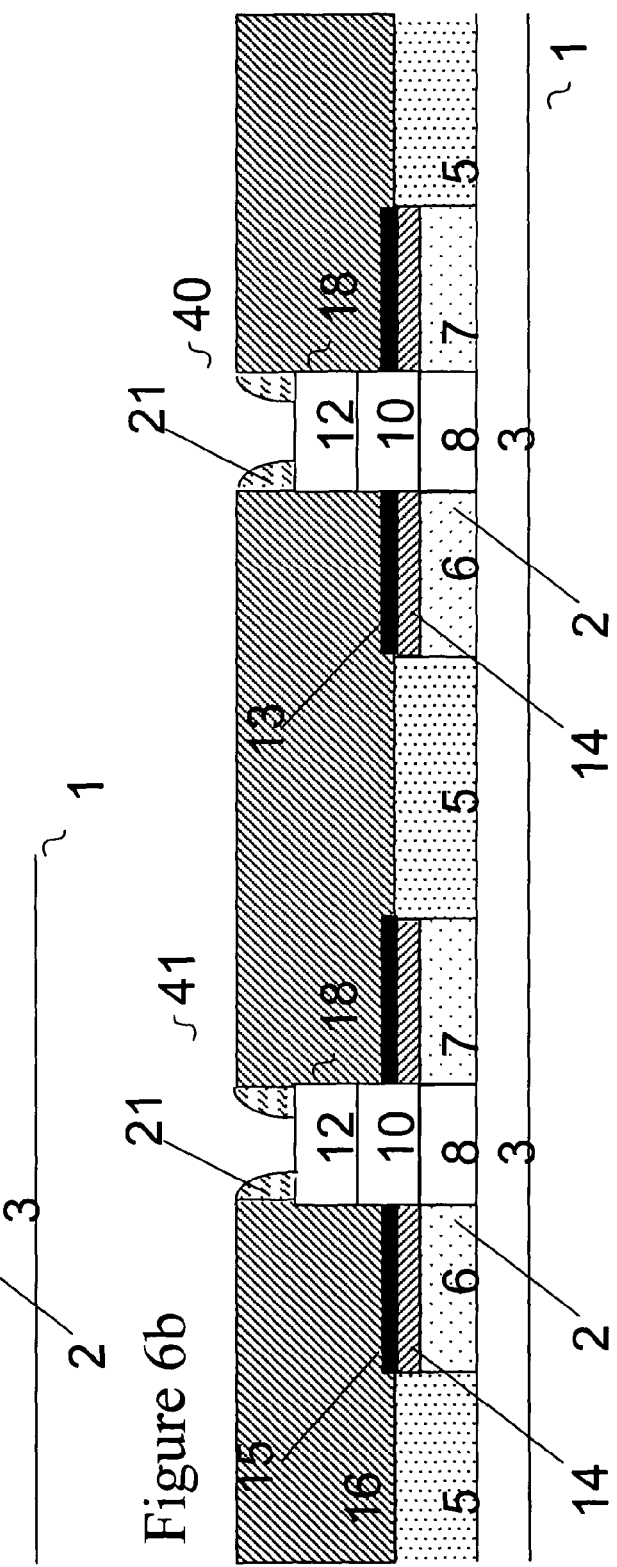
Figure 6a
Figure 6b

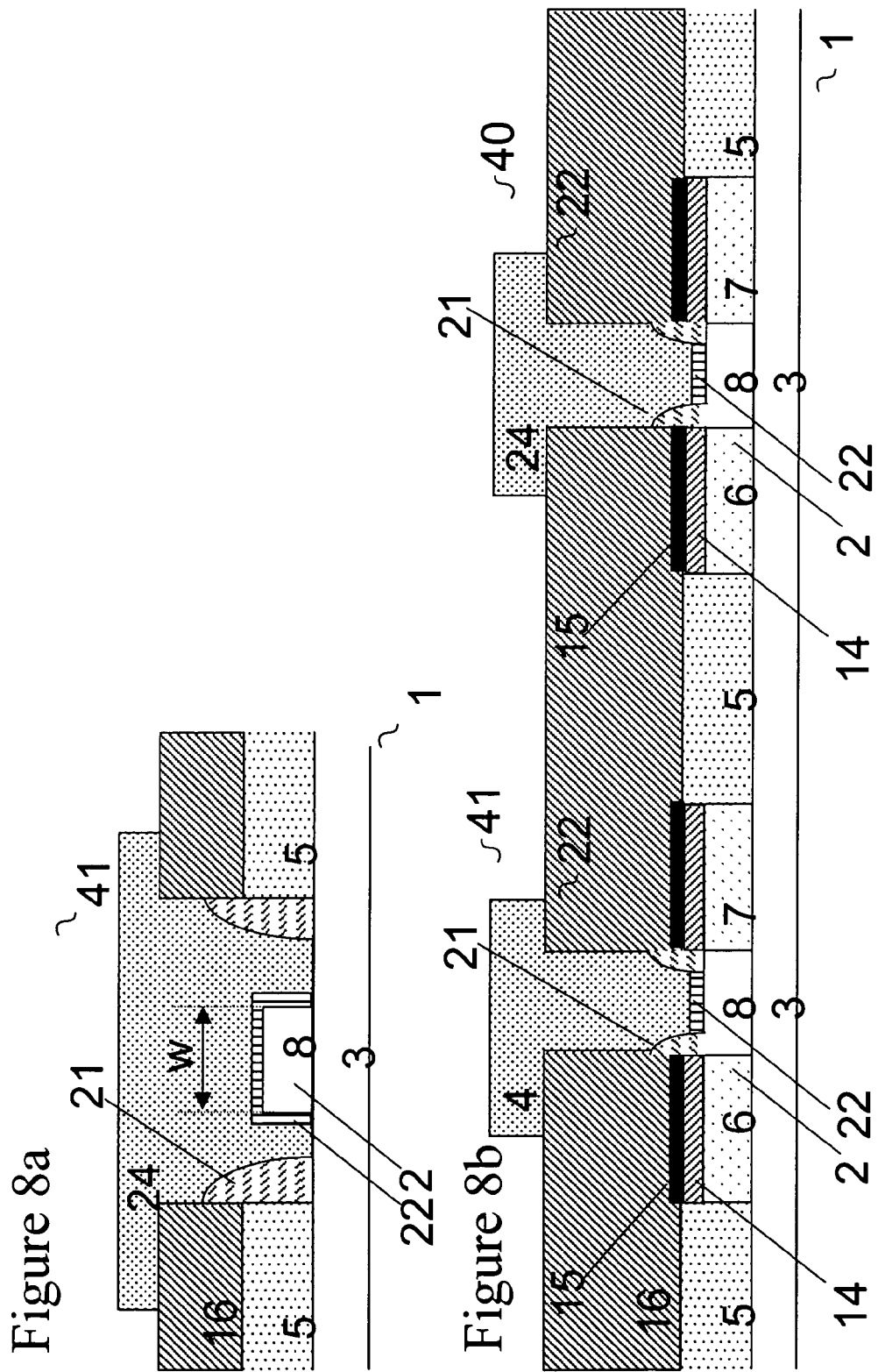

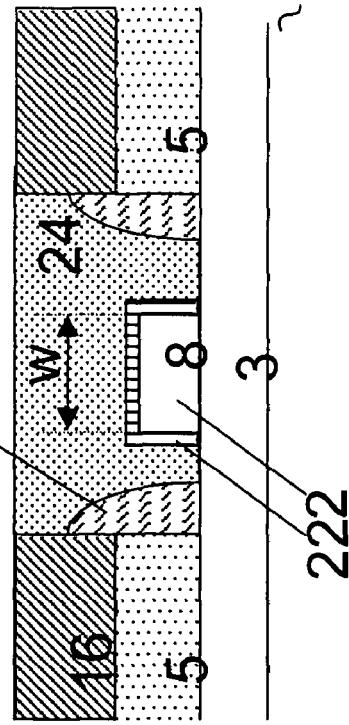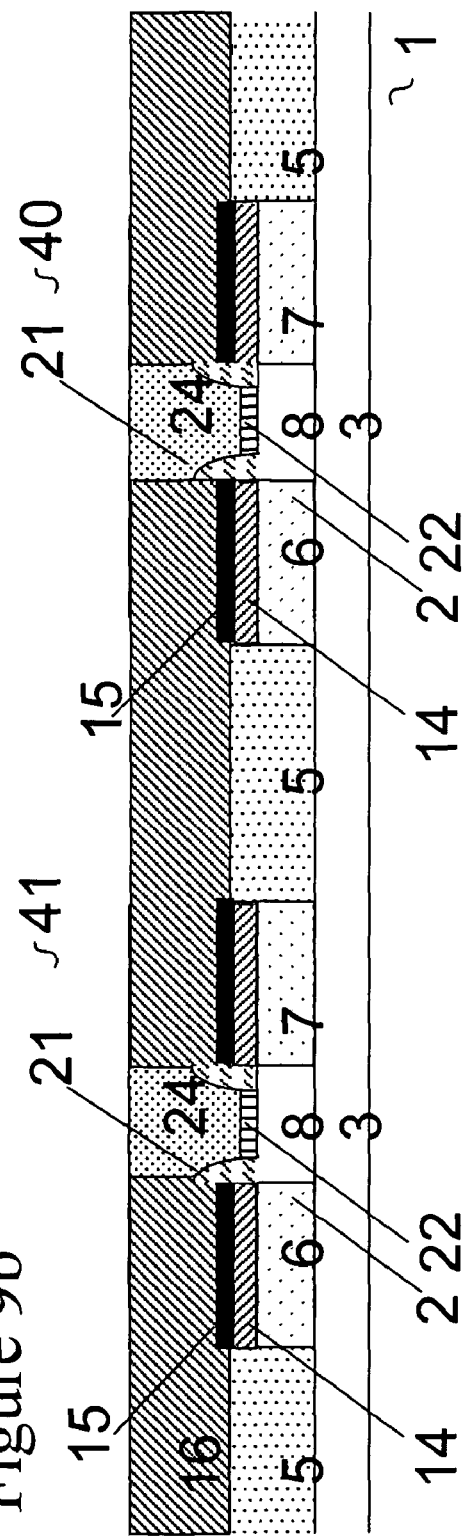

INTEGRATED SEMICONDUCTOR FIN DEVICE AND A METHOD FOR MANUFACTURING SUCH DEVICE

RELATED APPLICATIONS

This application claims the benefit of U.S. provisional application No. 60/396,710, filed Jul. 16, 2002, which is incorporated herein by reference.

BACKGROUND OF THE INVENTION

1. Field of the Invention

The present invention generally relates to so-called fin field effect transistors (FET) integrated in a full complementary metal-oxide-semiconductor (CMOS) device process flow. More particularly this invention relates to the integration in such a full CMOS process flow of n-type FinFETs and/or p-type FinFETs having a channel length of about 100 nanometer or less.

2. Description of the Related Technology

Today's state-of-the-art semiconductor chips feature technology nodes of 0.18 micron (180 nanometers) with 0.13 micron (130 nanometers) technologies just beginning to reach the marketplace. Now the industry plans to deliver 90 nanometers in 2004, 65 nanometers in 2007, 45 nanometers in 2010, 32 nanometers in 2013 and 22 nanometers in 2016. This 2001 schedule, as set forward in the International Technology Roadmap for Semiconductors (ITRS) defined by the Semiconductor Industry Association (SIA), translates to smaller chip dimensions earlier in time than previously thought. Among the main transistor scaling issues to be solved are the need for thinner gate oxides resulting in a higher on-current and hence increased switching speed, a smaller off-current and lower threshold voltage to allow such gate oxide scaling and the use of lower supply voltages, a higher channel mobility and smaller series resistance of the source/drain regions. In order to meet the stringent scaling requirements of this forecast, non-classical CMOS devices and novel materials, such as metal gate materials and high-k gate dielectrics, are currently under investigation.

One of these non-classical CMOS devices is the so-called FinFET, where the gate envelops at least partially the channel region, contrary to the classic planar device where the gate electrode is formed in one plane on top of the channel region, which is part of the substrate. This substrate further comprises the source and drain regions adjacent to the channel region. The idea of making a double gate transistor by using the sidewalls of a dry-etched silicon (Si) fin as conducting channels was published in 1998 by D. Hisamoto et al. in "A folded-channel MOSFET for deep-sub-tenth Micron Era" in the IEDM Technical Digest 1998 pp 1032–1034. In the Fin FET a thin gate line straddled a thin silicon channel fin. The fabrication process was not optimized and was meant solely for single device demonstration. The proposed process included the use of inside spacers, which could decrease the gate length beyond the lithographical limits. However, the process had some severe drawbacks. It didn't allow the manufacturing of CMOS devices because poly SiGe was used to form the source/drain regions for the pMOS device while poly Si was used to form the source/drain regions of the nMOS device. The final device was assembled by subsequently forming the fin channel, the gate and the source/drain regions. The source/drain areas were not aligned to the gate. The proposed process also didn't allow the integration of SOI CMOS FinFET with SOI BiCMOS.

Other fabrication processes, reported in literature, include many variations of one basic fabrication process called the "quasi planar" FinFET. Choi et al describe such an alternative in "sub 20-nm CMOS FinFET technologies", IEDM Technical Digest 2001, pp 421–424. This alternative is based on "spacer" lithography: the pattern of the masking Phosphorous-doped Silicon Glass (PSG) spacers is transferred to the underlying Silicon-On-Insulator (SOI) layer thereby having the width of the silicon fins corresponding to the width of the masking spacers. The process only allows submicron fins with a single width as determined by the PSG layer thickness. In this underlying silicon layer source/drain regions can be patterned using conventional lithographic processing. Instead of using this "spacer" lithography alternatives are known using e-beam lithography to pattern the silicon fin channels. Such a FinFET device is described in details in "High-performance symmetric-gate and CMOS compatible $V_t$ asymmetric-gate FinFET devices" in IEDM technical digest 2001 pp 437–440, by J. Kedzierski et al. An example of such a device is reproduced in the following drawings, wherein the source/drain regions or pads, as they are labeled there, are formed together with the fin channel in the SOI layer using optical lithography and a hard mask trimming technique. These "quasi planar" FinFET type of processes could allow the formation of CMOS devices. In most alternatives the source/drain areas are not aligned to the gate. As all the silicon of the SOI layer outside the source/drain pads and the fin area is removed, the devices are reciprocally insulated afterwards by forming a planarized oxide layer over the individual devices. The leakage at the edges of this mesa isolation however might degrade device performance. These "quasi planar" FinFET type of processes don't allow the incorporation of metal gates and high-k gate dielectrics easily. Especially the use of metal gates is important for CMOS devices since tuning of the gate workfunction by choosing the appropriate gate electrode material is probably the only way to tune the threshold voltage and thus the device performance.

In U.S. Pat. No. 6,252,284, a planarized fin device is disclosed. The inventors propose a complex process schema comprising the steps of first forming the fin, polishing the fin until its desired height is reached, depositing and patterning the gate dielectric and electrode as to cross the fin, forming a silicide on the exposed regions of the fin, forming source/drain areas by depositing a polysilicon layer over the crossing of fin and gate and polishing this deposited polysilicon layer down to the level of the gate electrode followed by an etch-back of the polished polysilicon layer below the level of the gate electrode, forming a silicide on the exposed surface of the gate electrode. The proposed process flow is very unlikely to be combinable with classical CMOS processing as it requires a large number of additional process steps in an order that is at some points reverse to classical CMOS processing.

In U.S. Pat. No. 6,118,161, an alternative process to form a FinFET is disclosed. The inventors use the same nitride hard mask to define in a first patterning step the mesa active areas (132) in an SOI layer (106) and to define in a second patterning step a disposable gate pattern (134) aligned to and within the active area (132). Source and drain area's are defined aligned to this disposable gate pattern. The substrate is covered with an insulating layer (114) being planarized to expose the disposable gate pattern. A slot pattern (136) is etched in this disposable gate pattern and this slot pattern is then used as a hardmask to form channel strips (108) between source and drain. The proposed method doesn't offer an efficient electrical insulation in between the active area's or between the gate and the source/drain regions.

SUMMARY OF CERTAIN INVENTIVE ASPECTS OF THE INVENTION

One aspect of the invention provides a double or triple gate semiconductor device, manufactured in a cost effective way. In this aspect of the invention, the device is in the submicron range or less. The device comprises a CMOS or BiCMOS device.

Another aspect of the invention provides a submicron FinFET that can be formed in combination with standard CMOS and/or BiCMOS devices. In this aspect of the invention, the devices overcome the deficiencies of the prior art such as short channel effects, leakage, lack of integratibility, lack of sufficient lateral isolation between the devices.

Another aspect of the invention provides a method for manufacturing such devices. In this aspect of the invention, this method allows the full integration of devices with standard planar CMOS and/or BiCMOS devices in an easy and cost-efficient way with a minimal number of additional process steps. These methods also allow the use of high-k gate dielectric and metal gate electrode within the devices of invention.

Another aspect of the invention is to overcome the deficiencies of the prior art.

In another aspect of the invention, at least one FinFET device is manufactured in a CMOS compatible way.

In another aspect of the invention, in a semiconductor layer on a substrate active areas are formed, insulated by field regions. On these active areas at least one dummy gate is formed by depositing a layer or stack of layers and patterning this layer or stack of layers. This dummy gate can extend beyond the active area and overlap the field regions separating and insulating the active area's. Self aligned to and spaced apart by the dummy gate source and drain regions are incorporated in the semiconductor layer. The substrate is covered with a dielectric leaving only the dummy gate exposed. The exposed dummy gate is patterned to create a cavity spacing apart the source and drain regions. Spacers are formed against the sides of the cavity to cover the exposed sidewalls of the source and drain regions. The patterning of the dummy gate yields a dummy fin in the cavity extending from the source and drain region. This dummy fin is used to pattern the underlying semiconductor layer yielding a semiconductor fin connecting the source and the drain. The dummy fin can be completely removed from a triple gate device, whereby the gate dielectric has substantially the same thickness when straddling the semiconductor fin. If the dummy fin is only partially thinned, a double gate device is formed, whereby a thinner gate dielectric couples the gate electrode to the semiconductor fin at the sidewalls, while the remaining dummy fin on top of the semiconductor fin isolates the gate electrode from the top surface of the semiconductor fin.

In another aspect of the invention, classical planar CMOS or BiCMOS devices can be formed in an integrated way with a FinFET device.

In another aspect of the invention, when using the above process sequence planar CMOS or BiCMOS devices can be made while manufacturing the FinFET device. On some active areas FinFET devices can be formed while on other active areas planar MOS devices can be formed. If the dummy gate comprises a conductive layer, e.g., polysilicon, on top of a dielectric layer, e.g., siliconoxide, this dummy gate can serve as the gate of a planar device. The patterning of the dummy layer in order to form the dummy gate includes then patterning the dummy layers in order to form the planar gate. Ion implantation can be formed self-aligned to the dummy gate and planar gate to form the source and drain regions of both types of devices. Spacers can be formed against the dummy gate and planar gate as is common practice in planar CMOS technology. After covering the substrate with a planarizing dielectric leaving only the dummy gate exposed, the planar gate remains unaffected and is protected during further processing, e.g., by applying only masked removal steps. In case of replacement gate devices the dummy gate is not patterned to form the fin but is completely removed because a replacement gate device differs from the classic planar device in that the high-k dielectric and/or metal gate is formed after forming the device structure.

In another aspect of the invention, high-k dielectrics and/or metal conductor are introduced to form a FinFET device with the desired electrical characteristics. The proposed sequence allows the use of high-k dielectrics as gate dielectrics or metals as gate electrode material, because first the device structure is formed and covered with a protective dielectric only leaving the dummy gate exposed. When depositing the high-k dielectric and/or a metal gate layer these layers are only in contact with the channel part of the semiconductor fin.

Another aspect of the invention provides a CMOS circuit. This CMOS circuit comprises at least two active areas formed in a semiconductor layer, the at least two active areas are insulated from each other by field regions. Each of the active areas comprises at least one FinFET device. Each of the FinFET devices comprises a source and a drain area formed in the semiconductor layer, and a spacing in between, and a semiconductor fin formed in the same semiconductor layer and extending in the spacing from the source to the drain. An insulating oxide covers the CMOS circuit outside the spacing, and spacers are formed against the sidewalls of the spacing. The CMOS circuit further comprises a stack of a gate dielectric and a gate electrode overlapping the semiconductor fin. Preferably the gate dielectric comprises a high-k dielectric. Optionally the gate electrode comprises a metal. The stack of gate dielectric and gate electrode can be patterned to extend beyond the spacing or can be planarized to only fill the cavity in between the source and drain region. The CMOS circuit can further comprise at least one active area comprising at least one planar FET device.

BRIEF DESCRIPTION OF THE DRAWINGS

All drawings are intended to illustrate some aspects and embodiments of the invention. Devices are depicted in a simplified way for reason of clarity. Not all alternatives and options are shown and therefore the invention is not limited to the content of the given drawings. Like numerals are employed to reference like parts in the different figures.

FIGS. 2a and 2b show respectively the cross-sections AA and BB of FIG. 1 after patterning the dummy gate stack.

FIGS. 3a and 3b show respectively the cross-sections AA and BB of FIG. 1 after patterning polishing the insulating dielectric.

FIGS. 4a, 4b and 4c show respectively the cross-sections AA and BB of FIG. 1 after patterning the dummy gate stack.

FIGS. 5a and 5b show respectively the cross-sections AA and BB of FIG. 1 after partially removing the patterned dummy gate stack.

FIGS. 6a and 6b show respectively the cross-sections AA and BB of FIG. 1 after forming the inside spacers.

FIGS. 8a and 8b show respectively the cross-sections AA and BB of FIG. 1 after etching the gate electrode.

FIGS. 9a and 9b show respectively the cross-sections AA and BB of FIG. 1 after planarizing the gate electrode.

DETAILED DESCRIPTION OF CERTAIN INVENTIVE EMBODIMENTS

In relation to the appended drawings, embodiments of the invention are described in detail in the sequel. It is apparent, however, that a person skilled in the art can imagine several other equivalent embodiments or other ways of executing the present invention, the spirit and scope of the present invention being limited only by the terms of the appended claims.

The double or triple gate MOSFET is considered as the most promising device architecture for scaling CMOS into the deep sub-100 nm regime. Improved short channel effects and current drive capability are important features of this device. The fabrication of this device architecture is not straightforward and several attempts have been made to fabricate these devices in an economically acceptable way. As already outlined in the related technology section a variety in double gate devices exist and there are different process sequences for manufacturing such double gate MOSFET's each sequence having its associated advantages and disadvantages. Hence the particular order and specific steps in each process can be important to describe the fabrication of a particular device. Altering a step or sequence in a process flow may therefore result in a MOSFET or CMOS device with different characteristics.

Figure 1:
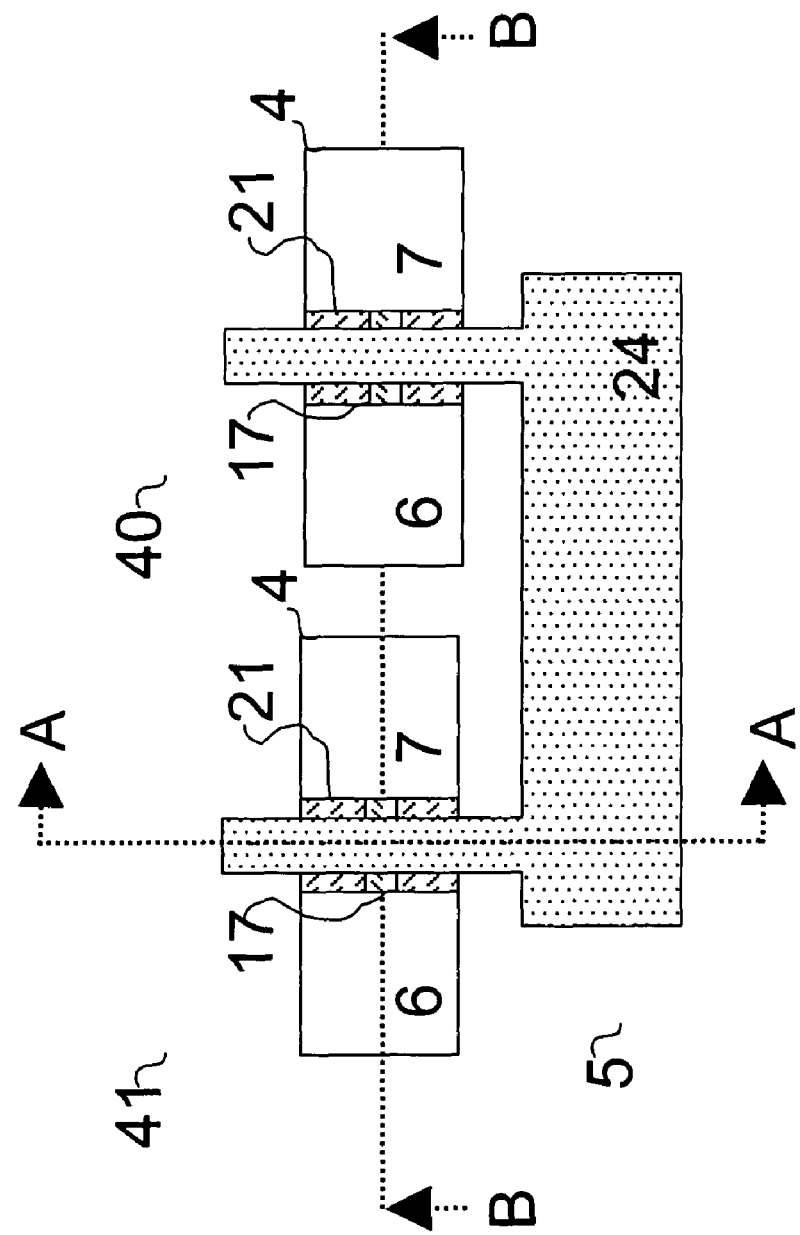
FIG. 1 shows a top view of a CMOS inverter circuit according to one aspect of the invention.

For the purpose of teaching the invention the process for forming a CMOS inverter circuit will be outlined. FIG. 1 shows a top view of a CMOS inverter according to one aspect of the invention. The field oxide region 5 isolates the active areas 4 in which respectively the nMOS device 40 and the pMOS device 41 of the CMOS inverter are formed. Both devices 40, 41 have the gate electrode 24 in common. This gate electrode 24 straddles the semiconductor fin 17 connecting the source 6 and the drain 7 of the MOSFET. As shown in the figure the gate electrode 24 extends beyond the active area 4 and overlaps the field region 5. The semiconductor fin 17, the source 6 and the drain 7 area of the transistors are formed in the same, continuous, layer 2 (not indicated). Against the sidewalls of the area 8 inside the active area 4 and outlined by the source 6, the drain 7 and the field region 5, sidewall spacers 21 are formed (FIG. 6a). These sidewall spacers 21 are formed 20a in this area 8 adjacent to the semiconductor fin 17, and above 20b the semiconductor fin 17 thereby offsetting the gate electrode 24 from the edges of the source 6 and drain 7 regions (FIG. 8a). These sidewall spacers 21 also decrease the unwanted capacitive coupling between the gate electrode 24 and the source and drain regions 6, 7. Cross-sectional drawings of this inverter will be used to illustrate various process steps. In figures "a" the section AA made along the channel of a MOSFET is shown while in figures "b" the section BB along the fin perpendicular to section AA is shown.

Referring to FIGS. 2a and 2b, the processing starts with a substrate 1. Typically this substrate 1 is a semiconductor substrate such as a silicon or germanium wafer. In one embodiment, this substrate is a Silicon-On-Insulator (SOI) wafer 1, with a top layer of silicon 2 upon an underlying oxide layer 3. However, a semiconductor wafer 1 can be used on which only locally SOI regions are created by, e.g., only forming a stack of the semiconductor layer 2 on top of the dielectric layer 3 on top of the substrate 1 in selected areas. This stack can be obtained, for example, by locally forming the dielectric layer 3 in the selected areas, e.g., by growing an oxide, and then locally forming the semiconductor layer 2 on this dielectric layer 3, e.g., by selective atomic layer CVD (Chemical Vapor Deposition), as appreciated by a person skilled in the art. Within these selected areas devices according to one aspect of the invention are formed while in the non-selected areas, i.e. the non-SOI regions, classical bulk planar CMOS devices can be made in this substrate 1. A person skilled in the art will understand that for a bulk FET the channel region or at least the space charge region of the channel area formed during operation of the device will extend into the bulk of the semiconductor substrate 1, whereas in case of a SOI device the dielectric layer 3 separates the device layer 2 from the bulk of the substrate 1.

For the purpose of teaching the invention an SOI wafer is used as starting substrate. In the semiconductor top layer 2, active area regions 4 are defined by forming field regions 5 that laterally isolate these active area regions 4. Later on in the processing transistors will be formed within the perimeter of these active area regions 4. The field regions 5 can be created using standard isolation methods, such as growing a field oxide or forming trenches in the substrate 1 filled with a dielectric as is known in the shallow trench isolation (STI) method, while protecting the active area regions 4 with a nitride masking layer. In one embodiment of the invention, field insulation is used instead of mesa insulation. In the latter a semiconductor layer is formed on top of an insulation layer and active areas are defined within this semiconductor layer yielding islands of semiconductor on top of the insulating layer. A second insulating layer can be used to cover these semiconductor islands and the regions in between, but an interface between these two insulating layers is unavoidable and might lead to a leakage path between the semiconductor islands.

Field insulation techniques on the other hand offer the formation of an insulation layer extending above the level of the semiconductor layer comprising the active area's prior to forming transistors in these active area regions. Appropriate doping of the active area regions 4 can be done to result in the desired doping profiles within the semiconductor layer 2. For example, pwell and nwell regions for respectively receiving the nMOS and pMOS devices are formed by doping the active area regions 4 using e.g. ion implantation of boron and phosphorous, respectively. In some of the thus formed active areas, FinFETs, according to planar CMOS and/or BiCMOS devices, can be formed. As will be clear from the description, one embodiment of the invention allows to combine the formation of FinFET devices with classical planar devices without impacting the processing of these standard planar devices.

Figure 2C:
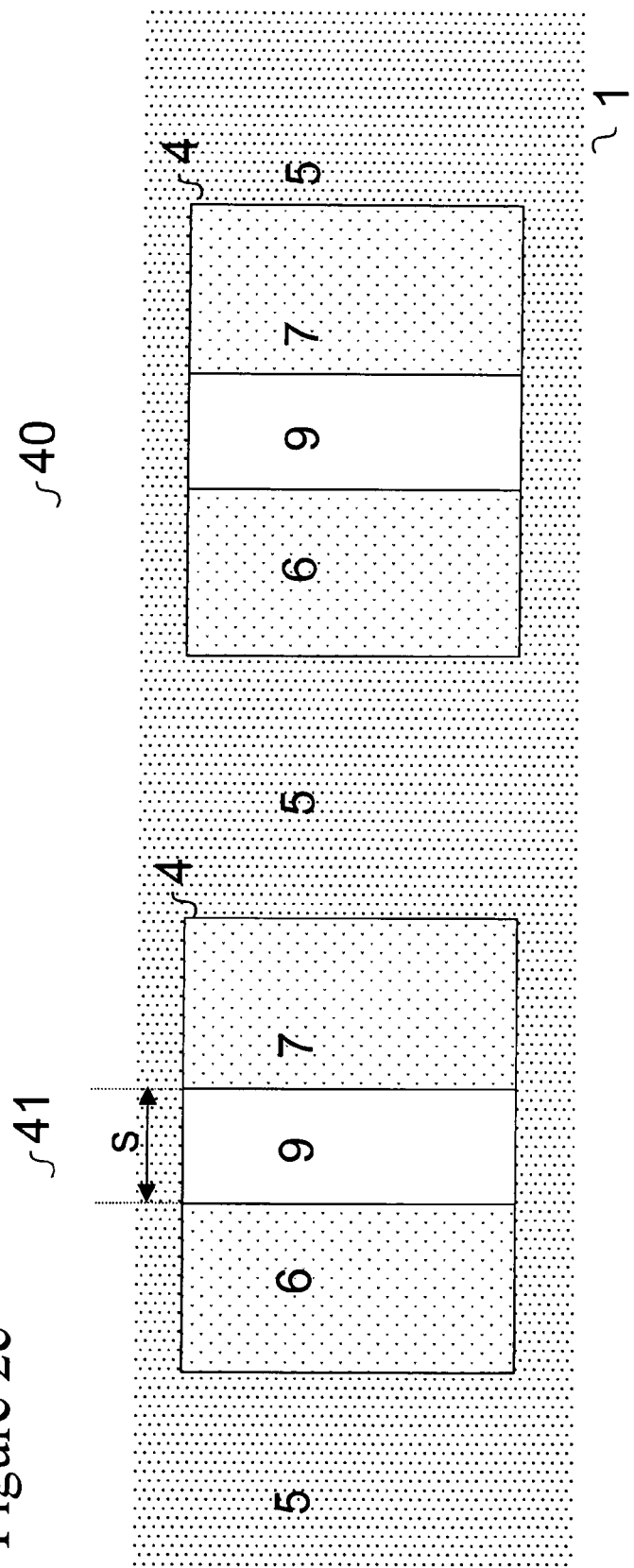
FIG. 2c shows the top view of FIG. 2b.

Within each active area 4 that is selected to have a FinFET 40,41 to be formed therein, a source region 6, a drain region 7 and a gate region 8 are outlined by forming a dummy gate structure 9 on top of this selected active areas as shown in FIG. 2c. The source 6 and drain 7 region are abutted by and aligned to this dummy gate structure 9, whereas the gate region 8, i.e., the region in between and separating the source 6 and drain 7 region, is covered by this dummy gate structure 9. The dummy gate structure 9 can comprise a single layer or a stack of layers whatever is appropriate. The dummy gate structure 9 can be formed using conventional semiconductor processing techniques, such as thermally growing an oxide 10 on top of the active area region 4 followed by a conformal deposition, e.g., by means of Chemical Vapor Deposition (CVD) process, of a top layer 11. This layer 11 can comprise a polysilicon 12 and/or a nitride layer 13. The deposited layers, in the example of a dual gate device being nitride 13 on top of polysilicon 12 on top of an oxide layer 10, are then patterned to yield the dummy gate structure 9.

In one embodiment, patterning the dummy gate stack 9 uses optical lithography and dry etching. One purpose of this dummy gate structure 9 is to determine the lateral spacing "s" between the source 6 and drain 7 region as shown in FIG. 2c, hence a more relaxed lithographic technology can be used for this patterning process. For example, 248 nm or 193 nm DUV technologies, which are used to define dimensions in the range of 100 to 400 nanometer in the photosensitive resist layer, can be applied. The dummy gate structure 9 will be removed later on in the process sequence and is at this stage in the process sequence only used to space apart the source 6 and drain 7 area. In one embodiment, the material or materials composing the dummy gate structure 9 has the ability to remove this material or these materials selective to the underlying layers or surrounding layer. In the example given above, the nitride layer 13 is selectively removable with respect to the polysilicon layer 12 of the dummy gate 9. This polysilicon layer 12 in its turn can be removed selective to the underlying oxide layer 10 using a dry etching process, while on its turn this oxide layer 10 of the dummy gate 9 can be removed selectively from the semiconductor material 2 by wet etching the oxide employing an HF-based solution. Other materials known to a person skilled in the art can be used to form the dummy gate structure 9. In another embodiment, the layer 11 or at least the top part 13 of this layer 11 can be used as a polish stop layer when planarizing the semiconductor using Chemical Mechanical Polishing (CMP).

The standard CMOS devices, not shown in the drawings, formed on active areas 4 other than the active areas 4 in which the devices according to one aspect of the invention are formed, can use this oxide 10 as the gate dielectric and this polysilicon layer 12 as the gate electrode layer. Patterning the dummy gate 9 also includes then patterning the gate stack of the planar CMOS devices. In one embodiment, dedicated gate dielectric and gate electrode layers are formed for these classical CMOS devices in which case the layers 10,11 used to form the dummy gate stack 9 are only applied to make the FinFET device according to one aspect of the invention. This dummy gate stack 9 can also serve as a dummy gate stack in order to create replacement gate devices. U.S. patent application publication No. 20010049183 A1, hereby incorporated by reference in its entirety, illustrates methods for forming such replacement gate devices.

FIGS. 2a and 2b show the cross-sections AA and BB of the inverter after the patterning of the dummy gate 9 of the nMOS 40 and pMOS 41 transistor. It is obvious for a person skilled in the art that the alignment of the dummy gate 9 as shown in FIG. 2a is a theoretical example whereas in processing the dummy gate 9 might overlap on the field regions 5 so as to compensate for misalignment errors. In case of a planar device the channel region between source and drain will stop at the border of the field region. An overlap of the gate electrode 24 over the field region will offer a control over parasitic transistors, which are present at the border between the field region 5 and the active region 4. In case of a FinFET device such border between a channel region 17 and the field region 5 can be present depending on the layout of the transistor. If the dummy gate 9 and consequently the gate electrode 24 can be patterned to overlay the active area 4, a good control of the gate electrode 24 over the underlying transistors can be obtained regardless of the layout and position of the individual channel regions 17 (FIG. 1).

If a thin film SOI wafer is used as starting substrate 1, the initial thickness of the thin SOI layer 2 might result in a very high series resistance within the finished transistor or might impede the growth of a silicide layer on the source 6 and drain 7 areas. For these and other reasons the thickness of the SOI layer 2 within the source 6 and drain 7 areas can be increased resulting in so-called elevated source and drain regions. In one embodiment the height of the silicon layer in the source 6 and drain 7 regions is increased by epitaxially growing a silicon layer 14 (FIG. 3b) selective on the exposed silicon starting substrate 2. As the dummy gate structure 9 is still present during this epitaxial growth, only the source 6 and drain 7 regions are exposed while the gate region 8 is protected and covered by the dummy gate 9. In one embodiment, the material or materials used for the dummy gate 9, or at least for the parts of the dummy gate 9 that are exposed during the growth, are also chosen to not allow any substantial growth of semiconductor material on them during forming elevated source and drain areas. The dummy gate 9 masks the gate area 8 during selectively growing semiconductor material in the exposed source 6 and drain 7 regions.

The source 6 and drain regions 7 are doped to obtain n- or p-type source and drain junctions with the desired doping profile for respectively the nMOS 40 and pMOS 41 transistor. In one embodiment, ion implantation is used to create a Highly Doped Drain (HDD) profile within the source 6 and drain regions 7. The doping profile is preferably uniform within the source 6 and drain 7 regions both in lateral as well as in vertical direction resulting in a uniform electrical current flow from the junctions 6,7 towards the gate area 8. As the dummy gate structure 9 is still present during implanting the source 6 and drain 7 regions the doping of the exposed source 6 and drain 7 regions is self-aligned to this dummy gate structure 9. Incorporating of the dopants within the source 6 and drain 7 regions of the FinFET devices according to one aspect of the invention can be done simultaneously with doping their counterparts of the planar MOS devices.

Optionally a silicide 15 (FIG. 3b), e.g. $TiSi_2$, $CoSi_2$, can be formed on the source 6 and drain 7 areas prior to covering the substrate surface with a dielectric layer. Methods for forming silicides are known to persons skilled in the art. The dummy gate 9 allows forming selectively silicides on the exposed source 6 and drain 7 areas.

A dielectric layer or stack of layers 16 is formed over the substrate comprising the field regions 5 and the active area regions 4 which comprise doped source 6 regions, doped drain 7 regions and the dummy gate structure 9 which covers the gate region 8 (FIGS. 3a, 3b). This dielectric layer 16 is sometimes referred to as the premetal dielectric (PMD) as it concludes in conventional CMOS processing the front end processing of the active devices being the planar CMOS and/or BiCMOS transistors. In one embodiment, this dielectric layer 16 is an oxide or oxide-like layer formed using CVD processes, such as plasma-enhanced CVD. After forming this planarizing dielectric 16 the substrate is polished, layer 11 of the dummy gate structure 9 is substantially exposed. This planarization by CMP will provide a surface having topography typically within 10 to 5%. The top layer 11 of the dummy gate 9 will act as a polish-stop layer during this polishing in order to have a polishing process that uses endpoint detection rather than a timed polishing step. During this polishing process, only the dummy gates 9 are exposed while the remainder of the substrate is covered with the dielectric 16 (FIGS. 3a, 3b). FIGS. 3a and 3b show the cross-sections AA and BB of the inverter after polishing of the insulating dielectric 16 and exposure of the top surface of the dummy gate 9. The active areas in which the classical planar devices are made, preferably remains covered with the insulating dielectric 16.

After forming the lateral isolation 5 of the active areas 4 and planarizing the dielectric 16 covering the substrate 1, thereby exposing the top layer 11 of the dummy gate 9, the fin-part of the FinFET will be defined. In the active areas 4 in which FinFETs will be formed, patterning of the homogeneous semiconductor layer 2 is done to yield the semiconductor fin 17 having the desired cross-sectional width "w" (FIGS. 4a, 4b). The semiconductor fin 17 connects the source 6 and drain 7 regions. In other active areas where the dummy gate structure 9 is still present but where replacement gate MOSFETs are to be formed, this additional patterning will be omitted because the dummy gate 9 will be completely removed, while in some active area's classical devices are formed without dummy gate and hence this patterning is also obsolete in these areas.

Figure 6C:
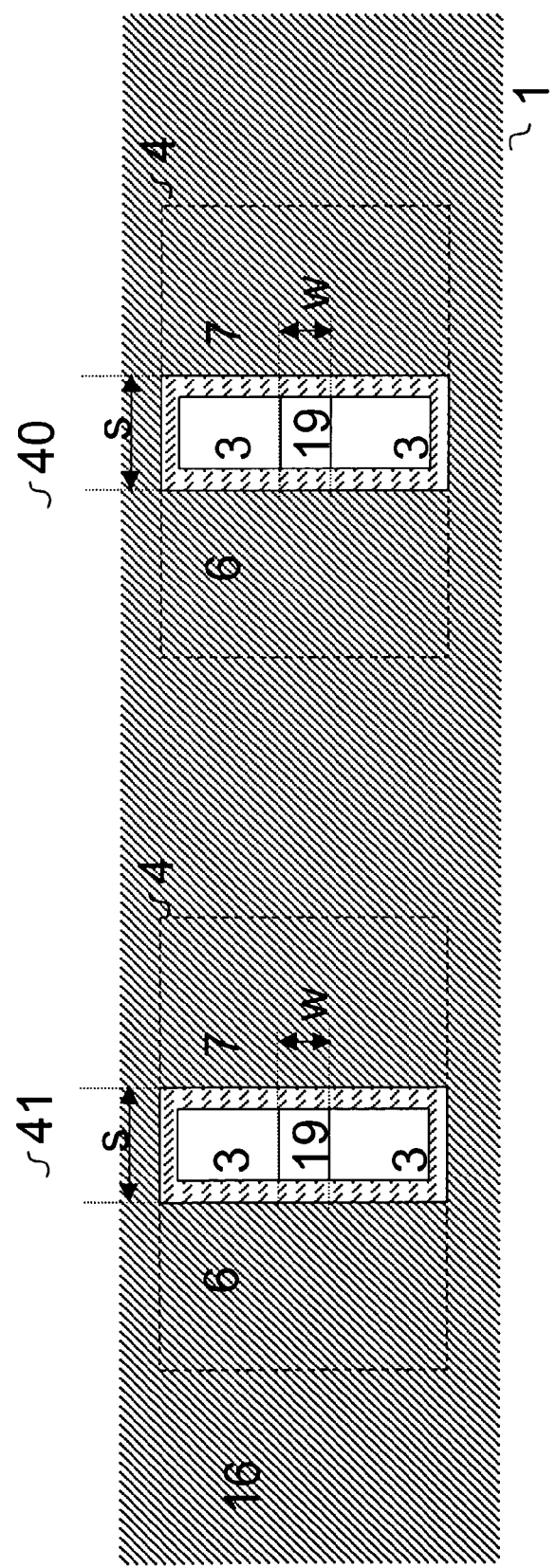
FIG. 6c shows the top view of FIG. 6b.

In the course of the proposed process flow the dummy layers 10 and 11 which optionally comprise layers 12,13, that constitute the dummy gate stack 9, are patterned twice to finally form the semiconductor fin 17. In a first patterning step the dummy gate 9 is formed to outline and to separate and space apart the source 6 and drain 7 regions. The spacing "s" between the source 6 and drain 7 regions corresponds to the length of the semiconductor fin 17. The second patterning that is now introduced, defines the cross-sectional width "w" of the fin 17 orthogonal to the spacing "s" (FIG. 6c). The dummy gate 9 and the semiconductor layer 2 underneath it are patterned to define the fin 18 (FIG. 6b) which comprises a top element 19 (FIG. 6a) formed in the dummy stack materials, e.g., the oxide 10 and polysilicon 12 and/or nitride 13 and a bottom element 17 which is the semiconductor fin. The selective removal of the exposed dummy gate stack 9 and the underlying semiconductor material 2 can be done in a single step. Both the exposed parts of the dummy gate 9 and the semiconductor material 2 are then removed using the resist pattern as a masking layer.

FIG. 4a shows the cross-section AA in case the dummy gate 9 and the underlying semiconductor layer 2 are patterned in a single step, self aligned to each other, to create an open cavity 25 in which respectively the dummy fin 19 and the semiconductor fin 17 are present. The selective removal of the exposed dummy gate stack 9 and the underlying semiconductor material 2 can also be done in a two-step process. First the dummy gate 9 is patterned to yield the top element 19 using the resist pattern as a masking layer as shown in FIG. 4b. By patterning the dummy gate a part of the open cavity 25 is now created in the dielectric 16 whose dimensions correspond to those of the dummy gate 9. Within the cavity 25 a dummy pattern 18 (FIG. 6b) remains extending from the source 6 to the drain 7.

After removing this patterned resist layer the patterned dummy gate stack or dummy fin 19 serves as a hardmask for the etching, self-aligned to the dummy fin 19 and the semiconductor layer 2, to yield the semiconductor fin 17. In this second etching the partially formed open cavity 25 is extended from the planarized dielectric 16 into the underlying semiconductor layer 2 to finally yield the complete open cavity 25 separating the source 6 and drain 7 area. The patterning of the fin 18 can be done using any lithographic technology. For example, photolithographic technologies such as 248 nm or 193 nm DUV technology, which are used to define dimensions in the range of 100 to 400 nanometer in the photosensitive resist layer, can be applied. In one embodiment of the invention, e-beam lithography is applied to define dimensions in the photosensitive resist layer of 100 nm or less, typically 50 nm or less. The thus formed resist pattern then masks the underlying layer or layers during the subsequent etching. Preferably, this etching is a dry etching because sub 100 nm features are to be formed in the dummy gate stack 9 and in the underlying semiconductor material 2.

Figure 4C:
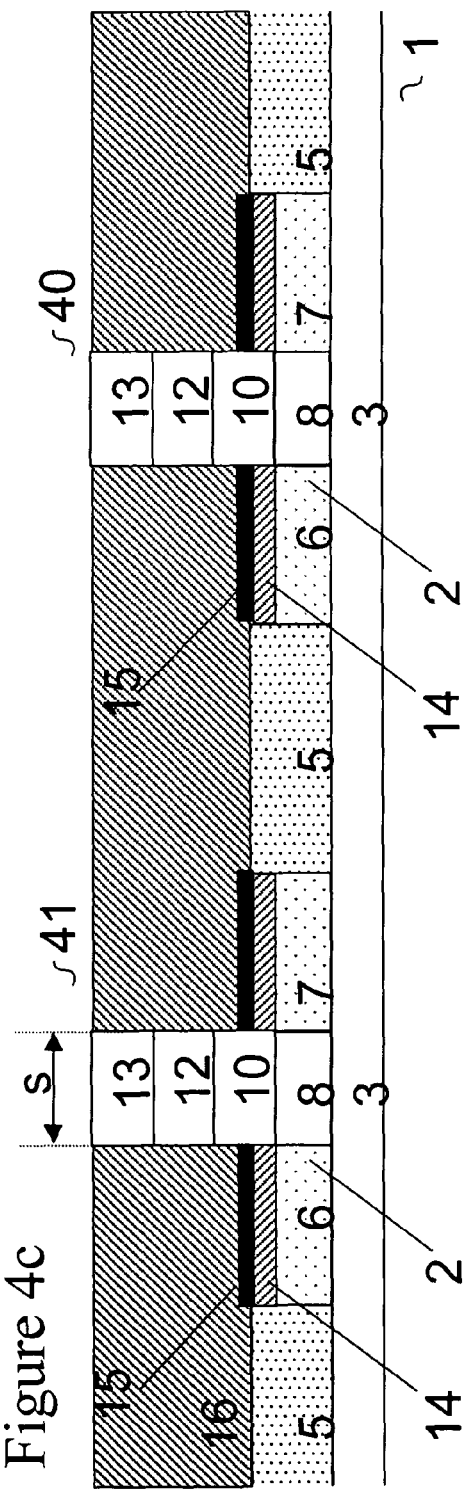
Figure 4D:
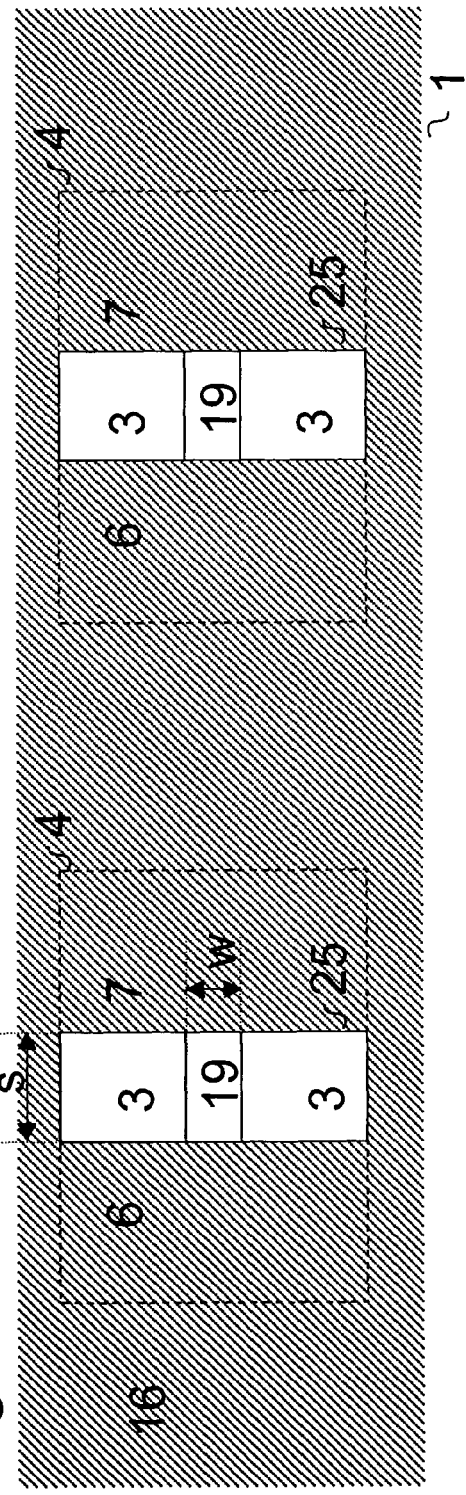
FIG. 4d shows the top view of FIG. 4c.

FIG. 4a shows the cross-sectional view AA of the inverter circuit after the dummy and semiconductor fin patterned and before the dummy fin 19 is at least partially removed. FIG. 4b shows the cross-sectional view AA of the inverter circuit after the dummy fin 19 is patterned. FIG. 4c shows a cross-sectional view BB of FIG. 4a. FIG. 4d is a top view of the inverter circuit at this stage of the processing. The substrate 1 is covered with the dielectric 16. Only the cavity 25 between the source 6 and drain 7 region is exposed. Within this cavity 25 the fin 17 (only the dummy fin 19 is shown in FIG. 4c) extends from the source side 6 to the drain side 7. For the purpose of teaching the perimeter of the active area 4 is indicated by a dashed line in FIG. 4d. At this stage of the processing the cavity 25 is not filled. As can be seen in FIG. 4d, the source 6, drain 7 and the semiconductor fin 17 underneath the dummy fin 19 are formed in the same semiconductor layer 2. Both source 6 and drain 7 stretch out on the left and on the right side of the semiconductor fin 17. Because the width of source 6 and drain 7 region is larger than the width of the semiconductor fin 2, contacting of the source 6 and drain 7 during the back-end-of-line processing is made easier.

Figures 5A, 5B:
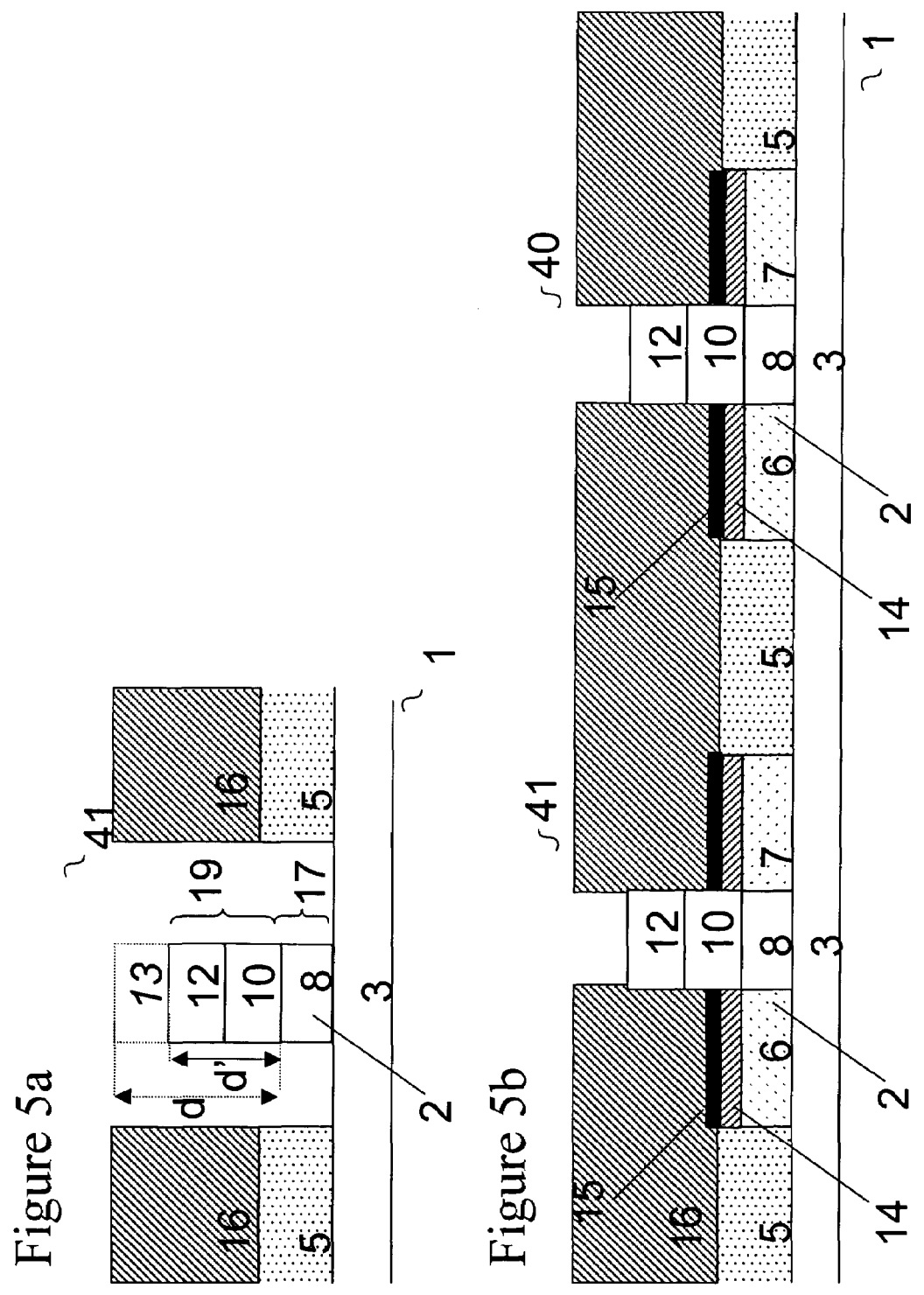
Figures 7A, 7B:
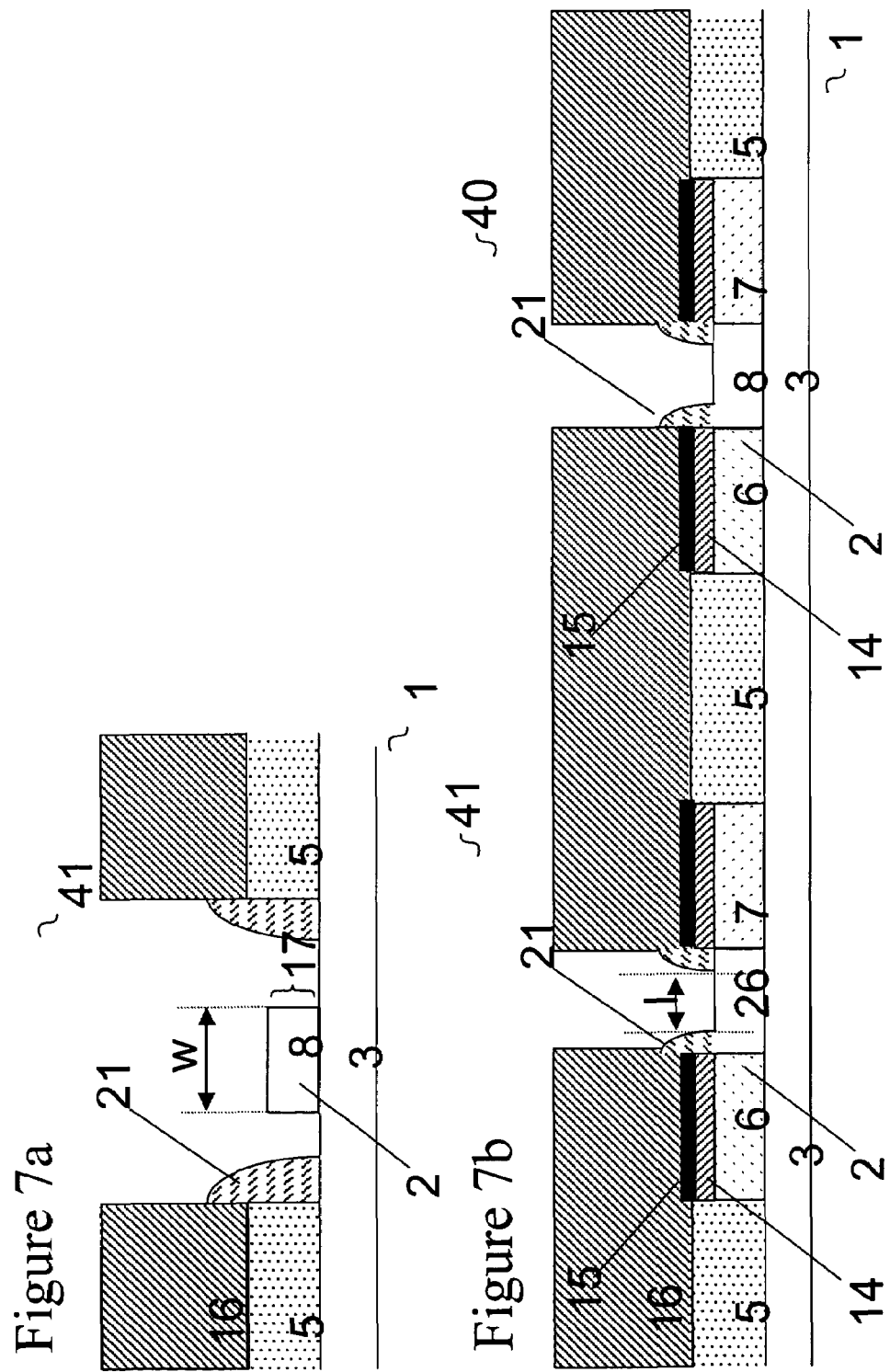
FIGS. 7a and 7b show respectively the cross-sections AA and BB of FIG. 1 after patterning the dummy gate stack and removing the dummy gate layers.

In case of double gate devices, the dummy fin 19 is partly removed. As shown in FIGS. 5a and 5b, a top part 13 of the patterned dummy gate stack 19 is removed to have the surface of the fin 18 (FIG. 6b) below the level of the planarized dielectric 16. In FIG. 5a the dashed square shows the removed part 13 of the dummy fin 19 whereby the as-deposited thickness d is reduced to the thickness d'. In the example given the nitride part 13 is selectively removed and the polysilicon part 12 is exposed. In case of triple gate devices the complete dummy fin 19 on top of the patterned semiconductor film 17 is selectively removed thereby exposing not only the sides but also the top surface of the semiconductor fin 17 as shown in FIGS. 7a and 7b.

After patterning the semiconductor fin 17 and lowering the surface of the fin 18 below the level of the planarizing dielectric 16, a short thermal oxidation can be performed to oxidize the exposed surfaces of the semiconductor fin 17. The thus-formed sacrificial oxide will be removed using a wet etching, e.g., a HF-based solution. This sequence of thermally oxidizing and wet etching of the thus formed oxide will remove the etching damage from the surface of the semiconductor fin 17. The width "w" of the semiconductor fin 17 can also be reduced, as a controlled part, i.e., the oxidized part, of the semiconductor fin 17 will be removed thereby thinning the semiconductor fin 17 below its lithographic defined width.

At this stage in the processing in the selected active area regions 4, a monolithic structure is present comprising a homogeneous semiconductor layer 2 in which a doped source 6 and drain regions 7 and a semiconductor fin 17 in between are formed. A dielectric layer 14 covers this monolithic structure only exposing the spacing 8 between the source 6 and drain 7 regions. Within this cavity having lateral dimensions corresponding to the spacing 8 the fin 18 having lateral dimensions "s" and "w" connects the source 6 and the drain 7.

Referring to FIGS. 6a and 6b, sidewall spacers 21 are now formed against the side walls of the cavity 25 formed in the dielectric 16 and the semiconductor layer 2. A dielectric layer 20 typically nitride, or a stack of layers, is deposited in a uniform way over the surface of the substrate, followed by anisotropically etching, e.g., dry etching, this dielectric layer 20 to form spacers 21. This etching creates the spacers 21 against the walls of the cavity 25 also on top of the lowered fin 18. No spacers 21 are formed on the sides of the fin 17. So the sides of the fin 17, including the sides of the dummy fin 19, are essentially free from the spacer dielectric 20 and remain exposed. These inside spacers 21 hence overlap the sidewalls of the source 6 and drain regions 7 adjacent to the fin 17 and form an insulating layer over these sidewalls. On the top surface of the fin 17 adjacent to the source 6 and drain 7 region also spacers 21 are formed. At this stage of the processing the source and drain regions 6, 7 are wrapped by dielectric material: in lateral direction at three sides by the field 5 dielectric surrounding the active area 4 and by the sidewall spacers 21, in vertical direction by the planarizing dielectric 16 and by the oxide layer 3. The height of this inside spacer 21 depends on the thickness of the deposited layers 20, the thickness of the semiconductor layer 2, including the epitaxial layer 14 if present, the planarizing dielectric layer 16 and on the spacer. By offsetting the top of the fin 18 by at least partially removing the dummy fin 19 process latitude is created to free the sides of the fin 17 from the spacer material 20 and still have spacers 21 formed against the sides of the cavity. These inside spacers reduce the parasitic coupling between the gate electrode 24 and the source 6/drain 7 regions thereby improving the operation of the device.

If replacement gate transistors are to be formed, the complete dummy gate 9 of these replacement gate transistors is now selectively removed to expose the unpatterned semiconductor layer 2 in between the source 6 and drain 7 region.

FIGS. 6a and 6b show the cross-sections of the inverter circuit after forming the inside spacers 21 for dual gate transistors. FIGS. 7a and 7b show the cross-sections of the inverter circuit for triple gate transistors after forming the inside spacers 21. In this case the dummy gate stack 19 is completely removed from the semiconductor fin 17.

After forming the doped source 6, the doped drain 7 and defining the semiconductor fin 17 in the same layer 2 of semiconductor material of the insulated active area region 4 and covering the surfaces of the source and drain regions with dielectric layers 16 and sidewall spacers 21, the final gate stack is formed. This gate stack is used for both the FinFET devices according to one aspect of the invention as well as for the replacement gate devices. First the gate dielectric 22 (FIG. 8b) is formed at least on the exposed surfaces of the semiconductor fin 17 and of the exposed surface of the unpatterned semiconductor layer 2 in case of the replacement gate device. This gate dielectric 22 can be an oxide, formed by thermal oxidation of the exposed semiconductor material.

High-k materials allowing a small equivalent-oxide-thickness (EOT) for thicker layers can also be applied. Such layers can be deposited over the surface of the substrate or selectively formed on the exposed surfaces of the semiconductor fin 17, e.g., by atomic layer CVD. Then conductive material 23 is deposited, typically to conformably cover the surface of the substrate 1, to form, after patterning, the gate electrode 24. The workfunction of this conductive material 23 must be selected or modified to yield the desired threshold voltage of the FinFET. Polycrystalline silicon can be used and its workfunction can be modified by incorporating the desired amount and type of dopants such as B, P, As, Sb, or by adding alloys such as Ge. Metals can be applied as gate electrode material if these metals posses the desired workfunction. In case CMOS devices are formed appropriate metals are to be selected to form respectively the nMOS and the pMOS gate electrode. Midgap metals can be used to serve as gate electrode for both the nMOS and the pMOS transistor.

The invention allows the use of high-k dielectrics and/or metal gates as the insulating layer 16 is only removed in those areas 8 where these high-k dielectrics 22 and/or metals 23 should be applied whereas the other regions remains protected by this layer 16. In this embodiment the cavity, formed in the planarizing dielectric 14 and in the semiconductor layer 2 by patterning the dummy gate 9 and the underlying semiconductor layer 2, is filled with the stack of gate dielectric 22 and gate electrode material 23.

If no gate dielectric 22 is present and the gate electrode 24 is directly contacting the semiconductor fin 17 a planar BiCMOS device instead of a CMOS device can be formed. The source 6 and drain 7 region are then used as emitter and collector regions while the gate electrode 24 acts as base electrode.

The gate of the FinFET is then defined by patterning the gate electrode material 23 in such a way that the gate electrode 24 extends over the cavity 25. This T-shaped gate electrode 24 will overlap the source 6 and drain 7 regions, but by selecting an appropriate thickness for the planarizing dielectric layer 14 the parasitic capacitance between the gate electrode 24 and the source 6 and drain 7 regions is kept low compared to the capacitance of the gate dielectric 21. FIGS. 8a and 8b show the cross-section of the inverter circuit for triple gate transistors with a T-shaped gate electrode using oxide as gate dielectric 22.

Alternatively chemical-mechanical-polishing (CMP) can be used to locally remove the gate electrode material 23 and to create a gate electrode 24. In case high-k gate dielectrics 21 and/or metals 23 are used, CMP is applied to planarize the substrate surface and to remove at least the gate electrode material 23 outside the cavity 25 in the planarizing dielectric layer 16. FIGS. 9a and 9b show the cross-section of the inverter circuit for triple gate transistors using oxide as gate dielectric 22 when gate electrode material 23 is polished down to the insulating dielectric 16.

In one embodiment the semiconductor fin 17 is not doped. Optionally a high temperature anneal step can be given to diffuse dopants out of the doped source 6 and drain 7 regions into the semiconductor fin 17. The dopant diffusion into the semiconductor fin 17 is preferably limited to the region underneath the inside spacer 21 on top of the semiconductor fin 17 and should essentially not diffuse in the channel region 26 of the fin. FIG. 7b shows for the pMOS device 41 the channel region 26 having a length "l" located in between the sidewall spacers 21 on top of the semiconductor fin 17. The thus doped part of the semiconductor fin 17 forms a good conductive connection between the channel part 26 of the transistor and the source 6 and drain 7 regions resulting in a lower overall series resistance of the transistor. This high temperature annealing can be a separate step, but preferably this high temperature anneal process also activates the dopants incorporated in all semiconductor elements of the device or circuit. In case of a metal 23 or high-k dielectric 22 this anneal process is given prior to the deposition of the metal 23 or high-k dielectric gate 21 whatever comes first. If a semiconductor material is used as gate material 23 is formed, this outdiffusion can be done after the deposition and doping of the semiconductor gate.

The diffusion of dopants into the semiconductor fin 17 is also needed to compensate for the offset between source 6 and drain 7 regions and channel area 26. Fine-tuning of the source/drain and well implantations, and anneal conditions is needed in order to provide sufficient outdiffusion and avoid misalignment between the channel 26 and the source 6 and drain 7 areas. The process sequence according to one aspect of the invention is a gate last process. Additional process steps can be performed such as additional local manipulation and modification of at least of the channel part 26 of the semiconductor fin 17. Examples of such extra local processing are incorporating of Ge in the channel region 26 or nitridation of the channel region to prevent outdiffusion of dopants from underneath the spacers 21 into the channel region 26.

A standard back-end-of-line (BEOL) processing will complete the processing. This BEOL process comprises forming insulating layers, defining vias and trenches in these insulating layers to contact underlying devices and interconnect levels, filing these vias and trenches with conductive materials to obtain the desired interconnect scheme. A person skilled in the art knows this part of a CMOS process flow and the various alternatives, such as dual damascene processing.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of forming a fin field effect transistor (FinFET) device, comprising:
   providing a substrate, comprising a semiconductor layer;
   forming a plurality of active areas, insulated from each other by field areas, in the semiconductor layer;
   forming at least one dummy gate on at least one of the active areas, wherein the at least one dummy gate extends beyond the at least one active area so as to form a connection with another dummy gate;
   forming source and drain regions within the at least one of the active areas, the source and drain regions being self aligned to the dummy gate;
   covering the substrate with an insulating layer as to leave the dummy gate exposed; and
   patterning the exposed dummy gate and the semiconductor layer so as to create an open cavity in the insulating layer and in the semiconductor layer and to form a dummy fin and a semiconductor fin aligned to the dummy fin in the cavity, both of the fins extending from the source region to the drain region, thereby exposing the semiconductor layer.

2. The method of claim 1, further comprising forming spacers against the sidewalls of the cavity.

3. The method of claim 2, wherein the providing the substrate comprises forming, at least within the at least one of the active areas, a dielectric layer separating the semiconductor layer from the substrate.

4. The method of claim 3, wherein the substrate comprises a silicon-on-insulator wafer.

5. The method of claim 4, wherein the covering the substrate comprises:
   forming the insulating layer on the substrate; and
   planarizing the insulating layer until the at least one dummy gate is exposed.

6. The method of claim 5, wherein the dummy fin comprises a stack of layers selectively removable from each other.

7. The method of claim 6, further comprising removing at least one layer of the stack of layers.

8. The method of claim 7, further comprising removing the remaining layers of the stack of layers.

9. The method of claim 7, further comprising:
   depositing a layer of gate dielectric and a layer of gate electrode material on the substrate; and
   planarizing the layer of gate dielectric and the layer of gate electrode material until the insulating layer is exposed.

10. The method of claim 7, further comprising:
    depositing a layer of gate dielectric and a layer of gate electrode material on the substrate; and
    patterning the layer of gate dielectric and the layer of gate electrode material to form a gate dielectric and a gate electrode overlapping the cavity.

11. The method of claim 9, wherein the layer of gate dielectric comprises a layer of high-k dielectric.

12. The method of claim 9, wherein the layer of gate electrode material comprises a metal layer.

13. The method of claim 1, further comprising forming at least one planar FET device on an active area other than the at least one of the active areas.

14. The method of claim 13, wherein the forming the at least one dummy gate comprises:
    depositing a stack of a dielectric layer and a conductor layer; and
    patterning the stack of layers to form at least one dummy gate and to form the gate of the planar FET device.

15. The method of claim 1, wherein the dummy fin comprises at least one of an oxide layer, a polysilicon layer and a nitride layer.

16. A complementary metal-oxide semiconductor (CMOS) circuit, comprising:
    at least two active areas formed in a semiconductor layer, the at least two active areas insulated from each other by field regions;
    each active area comprising at least one fin field effect transistor (FinFET) device; and
    each of the at least one FinFET device comprising a source and a drain formed in the semiconductor layer, and a cavity formed in between the source and the drain and common to each FinFET, with a semiconductor fin formed in the semiconductor layer and extending in the cavity from the source to the drain.

17. The CMOS circuit of claim 16, further comprising:
an insulating oxide layer covering the CMOS circuit outside the cavity; and
spacers formed against the inner sidewalls of the cavity.

18. The CMOS circuit of claim 16, further comprising a stack of a gate dielectric and a gate electrode overlapping the semiconductor fin.

19. The CMOS circuit of claim 17, wherein the gate dielectric comprises a high-k dielectric.

20. The CMOS circuit of claim 17, wherein the gate electrode comprises a metal.

21. The CMOS circuit of claim 17, wherein the stack of a gate dielectric and a gate electrode extends beyond the cavity.

22. The CMOS circuit of claim 17, wherein the stack of a gate dielectric and a gate electrode is coplanar with the insulating oxide.

23. The CMOS circuit of claim 16, further comprising at least one active area comprising at least one planar FET device.

24. The CMOS circuit of claim 16, wherein the circuit comprises a CMOS inverter.

25. A method of manufacturing a complementary metal-oxide semiconductor (CMOS) circuit, the method comprising:
providing a substrate, comprising a semiconductor layer;
forming a plurality of active areas, insulated from each other by field areas, on the semiconductor layer;
forming at least one dummy gate on at least one of the active areas and at least one gate on an active area other than the at least one of the active areas;
forming source and drain regions within the active areas, the source and drain regions being self aligned respectively to the dummy gate and to the gate;
covering the substrate with an insulating layer leaving the dummy gate exposed; and
patterning the exposed dummy gate and the semiconductor layer so as to form a dummy fin and a semiconductor fin aligned to the dummy fin, the dummy fin and the semiconductor fin extending from the source region to the drain region.

26. The method of claim 25, wherein the patterning comprises:
patterning the exposed dummy gate so as to form the dummy fin, the dummy fin extending from the source to the drain region; and
patterning the semiconductor layer so as to form the semiconductor fin in alignment with the formed dummy fin, the semiconductor fin connecting the source and drain regions.

27. The method of claim 25, wherein the FinFET device comprises at least one of an n-type FinFET device and a p-type FinFET device.

28. The method of claim 27, wherein the at least one of the n-type and p-type FinFET devices has a channel length of about 100 nanometer or less.

29. The method of claim 25, wherein the dummy fin comprises at least one of an oxide layer, a polysilicon layer and a nitride layer.

30. The method of claim 25, wherein the dummy fin comprises a plurality of layers being selectively removable from each other.

31. A method of forming a fin field effect transistor (FinFET) device and at least one planar FET device, comprising:
providing a substrate, comprising a semiconductor layer;
forming a plurality of active areas, insulated from each other by field areas, in the semiconductor layer;
forming at least one dummy gate on at least one of the active areas and at least one gate on another of the active areas;
forming source and drain regions within the at least one of the active areas, the source and drain regions being self aligned to the dummy gate;
covering the substrate with an insulating layer as to leave the dummy gate exposed; and
patterning the exposed dummy gate and the semiconductor layer so as to create an open cavity in the insulating layer and in the semiconductor layer and to form a dummy fin and a semiconductor fin aligned to the dummy fin in the cavity, both of the fins extending from the source region to the drain region, thereby exposing the semiconductor layer.

* * * * *

UNITED STATES PATENT AND TRADEMARK OFFICE
CERTIFICATE OF CORRECTION

PATENT NO. : 6,974,729 B2 Page 1 of 1
APPLICATION NO. : 10/621044
DATED : December 13, 2005
INVENTOR(S) : Nadine Collaert and Kristin De Meyer It is certified that error appears in the above-identified patent and that said Letters Patent is hereby corrected as shown below:

On title page (item 56)
Column 2, Line 10, Delete "FinFet" and insert --FinFET--, therefor.
Column 2, Line 19, Delete "V," and insert --$V_t$-- therefor.

Signed and Sealed this

Twenty-eighth Day of November, 2006

JON W. DUDAS
*Director of the United States Patent and Trademark Office*